(12) United States Patent
Tokida

(10) Patent No.: US 7,626,212 B2
(45) Date of Patent: Dec. 1, 2009

(54) LIGHT-EMITTING DEVICE AND LIGHT SOURCE APPARATUS USING THE SAME

(75) Inventor: Tsukasa Tokida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 552 days.

(21) Appl. No.: 11/448,229

(22) Filed: Jun. 7, 2006

(65) Prior Publication Data

US 2006/0284303 A1    Dec. 21, 2006

(30) Foreign Application Priority Data

Jun. 17, 2005    (JP)    ............................. 2005-177205

(51) Int. Cl.
*H01L 33/00*    (2006.01)
(52) U.S. Cl. .............................. 257/99; 257/91; 257/93; 257/95; 257/98; 257/100; 257/E33.056; 257/E33.057; 257/E33.058; 257/E33.065
(58) Field of Classification Search .................. 257/91, 257/93, 99, 95, 98, 100, E33.056, E33.057, 257/E33.058, E33.065
See application file for complete search history.

(56) References Cited

U.S. PATENT DOCUMENTS

2003/0002770 A1*    1/2003    Chakravorty et al. .......... 385/14
2005/0023548 A1*    2/2005    Bhat et al. .................... 257/99

FOREIGN PATENT DOCUMENTS

| DE | 100 33 502 | 1/2002 |
|---|---|---|
| DE | 10 2005 025 941 | 3/2006 |
| EP | 1 174 745 | 1/2002 |
| EP | 1 503 433 | 2/2005 |
| JP | 2005-32661 | 2/2005 |

OTHER PUBLICATIONS

German Office Action issued in German Application No. 10 2006 027 801.1-33 dated Mar. 28, 2007 and English translation thereof, 10 pages.
Patent Abstracts of Japan, Publication No.: 2005-032661, Publication Date: Feb. 3, 2005, 2 pages.

* cited by examiner

*Primary Examiner*—Kiesha L. Rose
*Assistant Examiner*—Minchul Yang
(74) *Attorney, Agent, or Firm*—Osha • Liang LLP

(57) ABSTRACT

In a light-emitting device, a mount member mounting a semiconductor light-emitting element is mounted on a circuit board. A multilayer board is used for the mount member. A first conductive pattern formed on the surface layer of the multilayer board and a semiconductor light-emitting element are electrically connected. On the multilayer board, a second conductive pattern formed on an intermediate layer positioned closer to the circuit board than the first conductive pattern is electrically connected to the conductor part of the circuit board with a conductive wire such as a gold wire. Power is fed from the conductor part to the semiconductor light-emitting element via the conductive wire and the conductive patterns.

8 Claims, 7 Drawing Sheets

LIGHT-EMITTING DEVICE AND LIGHT SOURCE APPARATUS USING THE SAME

BACKGROUND OF THE INVENTION

1. Field of the Invention

The present invention relates to a technique for performing electric connection from a light-emitting chip to a circuit board via an intermediate layer of a sub-mount in a light-emitting device that mounts a light-emitting chip by using a sub-mount.

2. Description of the Background Art

There is known a lamp unit including a lens and a reflector that uses a light-emitting device such as a light-emitting diode (LED) as a light source. For example, in application to a vehicular lighting fixture, it is possible to obtain desired light distribution using a direct projection-type or reflective-type unit.

FIGS. 7 and 8 schematically show examples of the structure of such a light-emitting device.

In the example a shown in FIG. 7, an LED chip (d) and an electrostatic protection element (such as a Zenor diode and a capacitor) (e) are mountedon conductor patters (c, c) formed on a circuit board (b) and the LED chip (d) and the electrostatic protection element (e) are covered by a lens body (not shown).

In this example, the range of a solid angle "α" that is formed around the light-emitting part of the LED chip (d) and shown by broken lines (f, g) and a double-headed arrow in FIG. 7 serves as a light application range. In other words, the light application range is narrowed by the influence of shielding of light caused by a component such as the electrostatic protection element (e).

As shown by (h) in FIG. 8, by arranging a sub-mount (i) on the circuit board (b) and mounting the LED chip (d) on its surface, it is possible to increase the light application efficiency.

The sub-mount (i) is bonded to the circuit board (b) via a bonding material. On the upper surface of the sub-mount (i) are formed conductor patterns (j, j) The LED chip (d) is mounted on the conductor patterns (j, j).

Electric connection between the conductor patterns (j, j) and conductor patterns (c, c) on the circuit board is made using gold wires (k, k).

The sub-mount (i) on which the LED chip (d) is mounted, the gold wires (k, k) and the electrostatic protection element (e) on the circuit board (b) are covered by a lens body (not shown).

In this example, the range of a solid angle "β" that is formed around the light-emitting part of the LED chip (d) and shown by broken lines (f', g') and a double-headed arrow in FIG. 8 serves as a light application range. In other words, it is possible to provide an ample light application range in the absence of the influence of shielding of light caused by a component such as the electrostatic protection element (e) (β>α).

The configuration of FIG. 8 has a problem that the gold wires for connecting the conductor patterns on the sub-mount and the circuit board shields the light emitted from the LED chip. That is, part of the gold wires (k, k) protruding above the upper surface of the sub-mount (i) (mounting surface of the LED chip (d)) results in a shadow of the part, thus influencing the light distribution.

The gold wire must be long enough to connect the conductor pattern (j) formed on the upper surface of the sub-mount (i) and the conductor pattern con the circuit board (b). For example, it is necessary to see to it that deformation resulting from stress caused by vibrations will not have an adverse effect on reliability. Additionally, gold wire has a very small diameter and thus a low strength, so that protection using a lens body is essential to protection from damage to the gold wire being handled.

SUMMARY OF THE INVENTION

One or more embodiments of the invention prevent shielding of light caused by a wire material for electric connection between a light-emitting element and a circuit board from having an adverse effect on light distribution and to reduce the connection distance thus enhancing reliability.

In one or more embodiments, the invention provides a light-emitting device comprising a mount member mounting a semiconductor light-emitting element, wherein the mount member is mounted on a circuit board, said light-emitting device comprising one or more of the following configurations:

(I) At least part of the mount member comprises a multilayer board, and a first conductive pattern formed on a surface layer of the multilayer board and a semiconductor light-emitting element are electrically connected.

(II) On the multilayer board, a second conductive pattern formed on a layer positioned closer to the circuit board than the first conductive pattern is electrically connected to a conductor part of the circuit board and power is fed from the conductor part to the semiconductor light-emitting element via the second conductive pattern and the first conductive pattern.

A light source apparatus according to one or more embodiments of the invention comprises a light-emitting device comprising a mount member mounting a semiconductor light-emitting element, wherein the mount member is mounted on a circuit board, and an optical system including an optical member, wherein said light source apparatus comprising the configurations under (I) and (II).

According to one or more embodiments of the invention, on the multilayer board, it is possible to connect the second conductive pattern closer to the circuit board than the first conductive pattern formed on the surface layer of the multilayer board with a conductor part of the circuit board. It is thus possible to overcome a disadvantage such as shielding of light by a connecting member caused by electric connection between the first conductive pattern and the conductor part of the circuit board.

With one or more embodiments of the invention, it is possible to eliminate an adverse effect on light distribution caused by the structure of electric connection between a light-emitting element and a circuit board and to reduce the connection distance between the second conductor pattern and the conductor part of the circuit board thus enhancing reliability.

For example, it is possible to readily perform wiring connection (such as wire bonding) by forming on the mount member a step part exposing part of the second conductive pattern.

Electric connection between the semiconductor light-emitting element and the first conductive pattern preferably uses face-down bonding. In one or more embodiments, it is preferable that, in case a conductive wire is used for electric connection between the second conductive pattern and a conductor part of the circuit board, the conductive wire does not protrude toward the element from the surface of the mount member mounting the semiconductor light-emitting element relative to the circuit board in order to avoid a shadow caused by the conductive wire. Since there is no influence on light distribution by a shadow, it is possible to use a wire having a large diameter thus increasing the current capacity and the mechanical strength.

A joint of the conductor part of the circuit board and part of the second conductive pattern using a conductive wire is reinforced with an electric insulating resin or glass material to enhance the strength and prevents vibration and eliminates the need for protecting the part with a lens.

A step part where an electrostatic protection element for protecting a semiconductor light-emitting element is mounted on a mount member is useful for downsizing and simplified assembly.

In order to efficiently utilize light from a light-emitting element in the application of one or more embodiments of the invention to a light source apparatus including the light-emitting device and an optical system including an optical member, a side face of the semiconductor light-emitting element oriented in a direction of irradiation of the optical system and a side face of the mount member are aligned with each other while positioned on the circuit board and a step part exposing part of the second conductive pattern is formed on a section close to the other end of the mount member in opposite direction to the irradiation direction. In one or more embodiments, it is preferable to electrically connect the exposed part of the second conductive pattern and the conductor part of the circuit board by using a conductive wire arranged so as not to shield light directed to the optical member from the semiconductor light-emitting element. In this way, a configuration is obtained where for example the conductive wire does not shield the light toward the front of the mount member (irradiation direction) in a direction parallel to the optical axis of the optical system.

DESCRIPTION OF THE EXEMPLARY EMBODIMENTS

Figure 1:
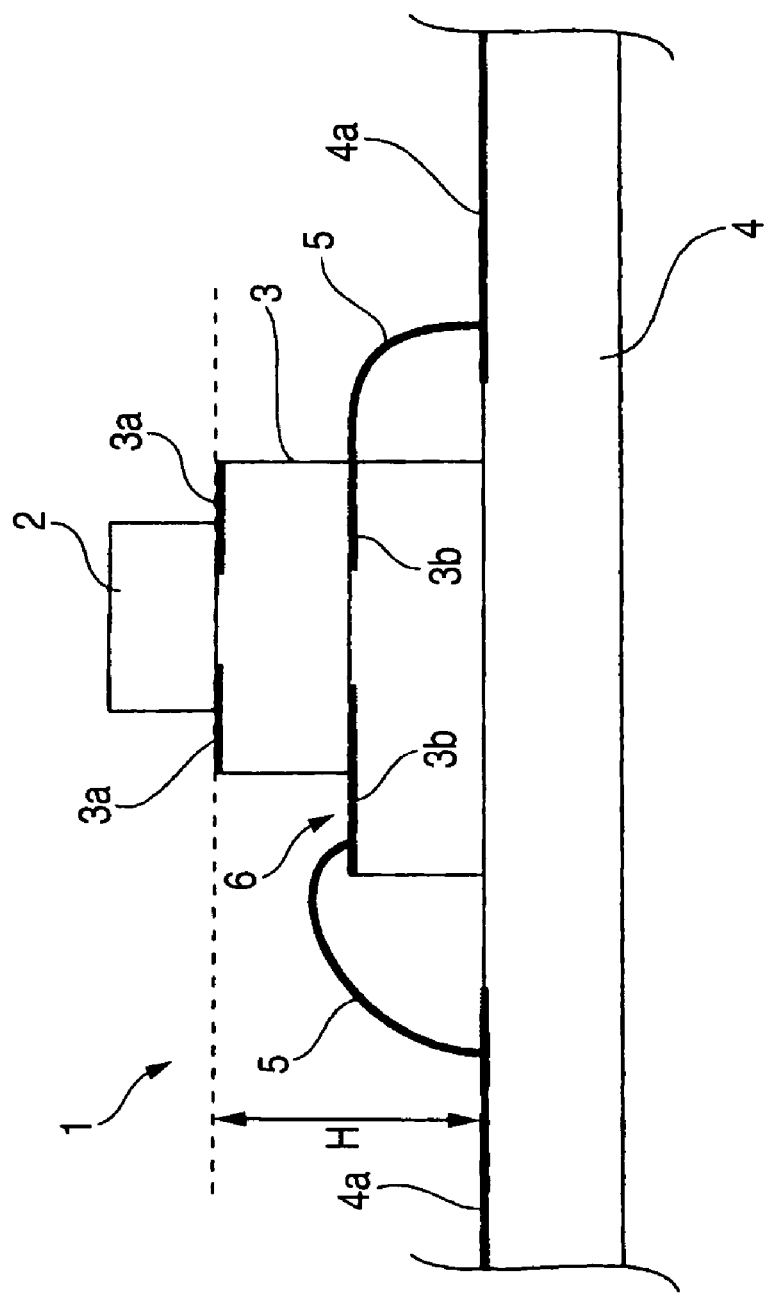
FIG. 1 is a schematic view illustrating the basic configuration of a light-emitting device according to an embodiment of the invention.

FIG. 1 is a schematic view illustrating the main parts of the basic configuration of a light-emitting device according to one or more embodiments of the invention.

A light-emitting device 1 includes a semiconductor light-emitting element 2 such as an LED chip, a mount member 3 mounting the element, and a circuit board 4 on which the mount member 3 is mounted.

The semiconductor light-emitting element 2 may be a light-emitting chip where a phosphor is applied to a uniform film, although any structure and material of the semiconductor light-emitting element 2 is within the scope of the invention.

Part or the whole of the mount member 3 (sub-mount) uses a multilayer board. For example, first conductive patterns 3a, 3a are formed on the surface layer of the multilayer board and connected to the electrodes of the semiconductor light-emitting element 2. For example, electric connection between the semiconductor light-emitting element 2 and the conductive patterns 3a, 3a is made by way of face-down bonding.

In a layer of the multilayer board positioned closer to the circuit board 4 than the conductive pattern 3a is formed a second conductive pattern. For example, as shown in FIG. 1, second conductive patterns 3b, 3b are formed on an intermediate layer of the multilayer board. The conductive patterns 3a and 3b are electrically connected by an internal conductor (via) in the layer.

The mount member 3 has a bottom surface bonded to the surface of the circuit board 4 by using a bonding material (not shown).

On the surface of the circuit board 4 are formed conductor parts 4a, 4a such as conductive patterns. The conductor parts 4a, 4a are respectively connected to the second conductive patterns 3b, 3b by using conductive wires 5, 5.

The connection may be such that, in one or more embodiments, as illustrated with the left side face of the mount member 3, the pattern 3b and the conductor part 4a are connected using the conductive wire 5 for bonding in a configuration including a step part 6 with part of the second conductive pattern 3b exposed. That is, one end of the conductive wire 5 is connected to the exposed part of the conductive pattern 3b and the other part is connected to the conductor part 4a.

Alternatively, in one or more embodiments, as illustrated with the right side face of the mount member 3, part of the second conductive pattern 3b may be connected to the conductor part 4a using the conductive wire 5, without providing the step part 6.

While both forms are shown for the purpose of convenience, in any form, a predetermined voltage is applied from the conductive patterns 3a, 3b to the semiconductor light-emitting element 2 via the conductive wires 5, 5 and the conductive patterns 3b, 3a by way of power feeding to the conductor parts 4a, 4a of the circuit board 4. In other words, in a multilayer board used for the mount member 3, the first conductive pattern 3a and the second conductive pattern 3b formed on a layer closer to the circuit board than the first pattern are electrically connected and the pattern 3b is electrically connected to the conductor part 4a of the circuit board 4 via the wire 5. Thus, power is fed from the conductor part 4a to the semiconductor light-emitting element 2 via the conductive patterns 3b and 3a.

Figure 8:
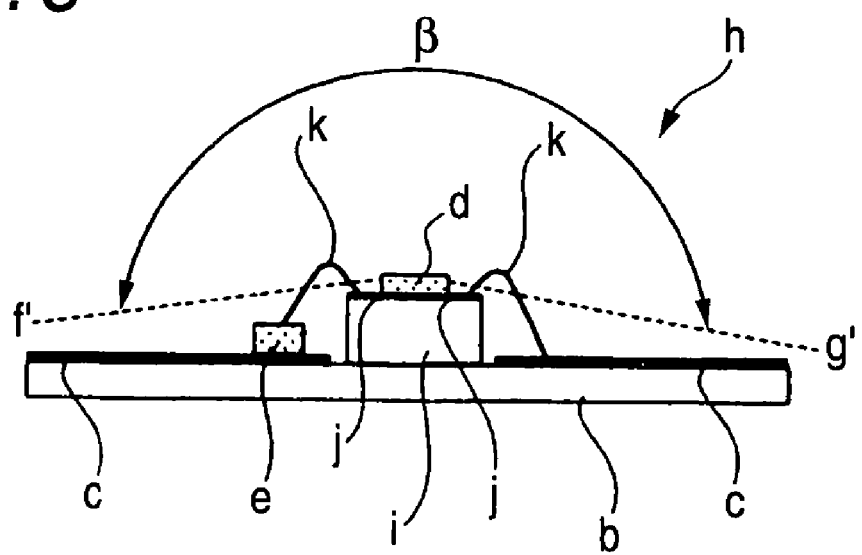
FIG. 8 is a schematic view showing another exemplary configuration according to the related art.

"H" in the figure represents the height from the surface of the mount member 3 mounting the semiconductor light-emitting element 2 to the circuit board 4. It is important that part of the conductive wire 5 connecting the second conductive pattern 3b and the conductor part 4a does not protrude upward beyond the height "H" in the figure. That is, in the related art configuration (see FIG. 8), part of a conductive wire necessarily protrudes upward from the mounting surface of the semiconductor light-emitting element 2 when the conductive pattern 3a is connected to the conductor part 4a using a conductive wire. The protruding part shields light coming from the semiconductor light-emitting element 2 thus making a shadow. In accordance with one or more embodiments of the invention, a configuration is assured where the conductive wire 5 does not protrude upward from the surface of the mount member 3 mounting the semiconductor light-emitting element 2 when the circuit board 4 is assumed as a reference, thereby avoiding the disadvantage.

In accordance with one or more embodiments, the length of the conductive wire.5 may be reduced compared with the related art. Thus, it is possible to increase the reliability concerning deformation resulting from stress caused by vibrations. Or, as a more positive measure, it is possible to provide sufficient anti-vibration and protection measures by covering the joint of the conductor part 4a and part of the conductive pattern 3b by way of the conductive wire 5 with an electric insulating resin or glass material.

While the bottom surface of the mount member 3 is bonded to the surface of the circuit board 4 in the illustrated configuration, in one or more embodiments of the invention, the conductive wire 5 may be omitted when a conductive layer is formed on the bottom surface of the mount member 3 and the layer is electrically connected to the conductor part of the circuit board 4. In one or more embodiments, in consideration of the problem of heat that accompanies a large current such as in a high luminance LED, it is desirable to increase heat dissipation with closer contact between the mount member and the circuit board. Thus, a conductive wire such as a gold wire is employed for energization.

In accordance with one or more embodiments of the invention, the first conductive pattern 3a formed on the surface layer (uppermost layer) of the mount member 3 using a multilayer board is electrically connected to the electrodes of the semiconductor light-emitting element 2. On the multilayer board 3, the second conductive pattern 3b formed on a layer positioned closer to the circuit board 4 than the first conductive pattern 3a is electrically connected to the first conductive pattern 3a. The second conductive pattern 3b is electrically connected to the conductor part 4a of the circuit board 4 and power is fed from the conductor part to the semiconductor light-emitting element 2 via the conductive patterns 3b, 3a.

FIGS. 2 through 5 show exemplary configurations of the light-emitting device according to one or more embodiments of the invention.

Figure 2:
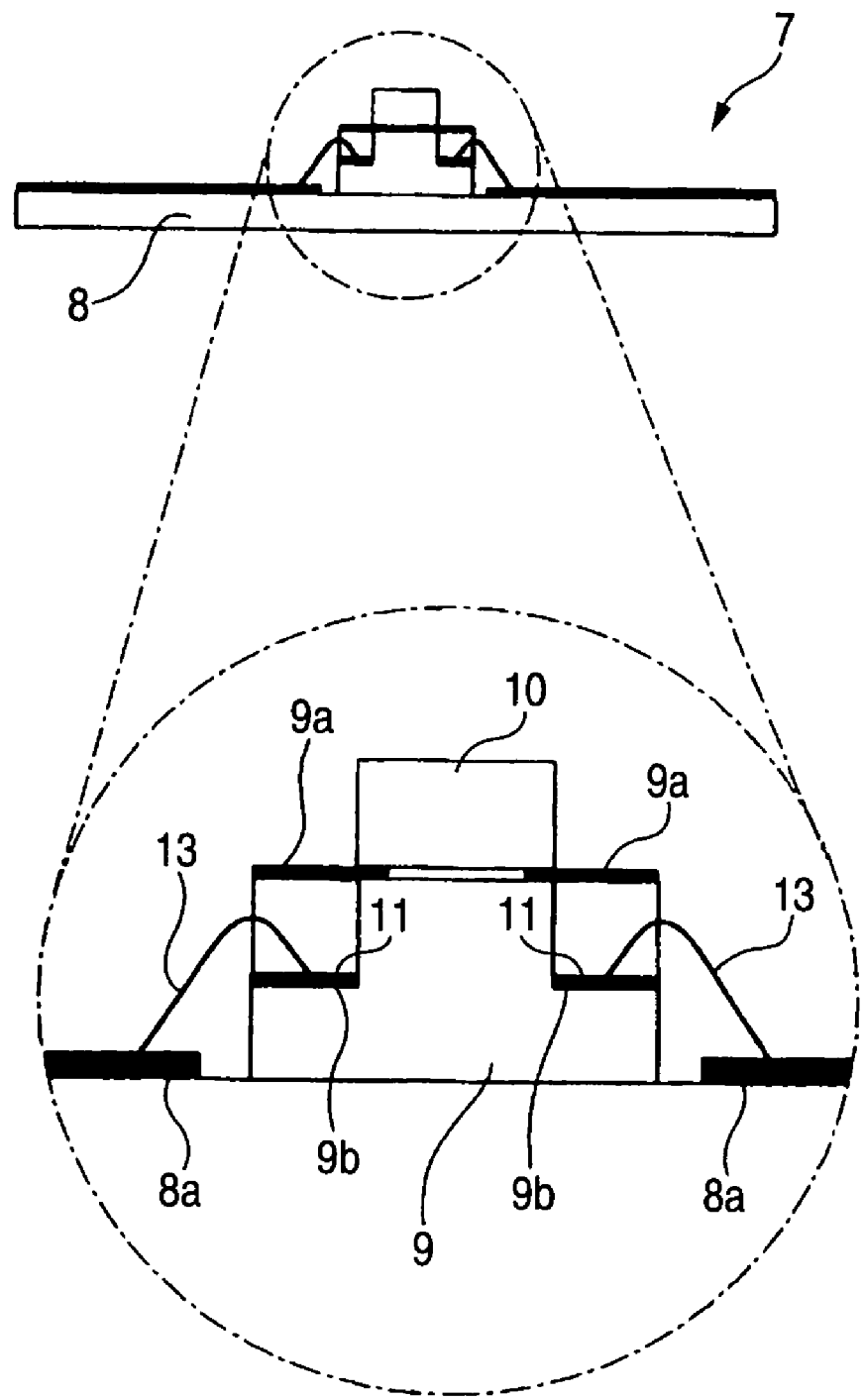
FIG. 2 shows an exemplary configuration of the light-emitting device according to an embodiment of the invention.
Figure 3:
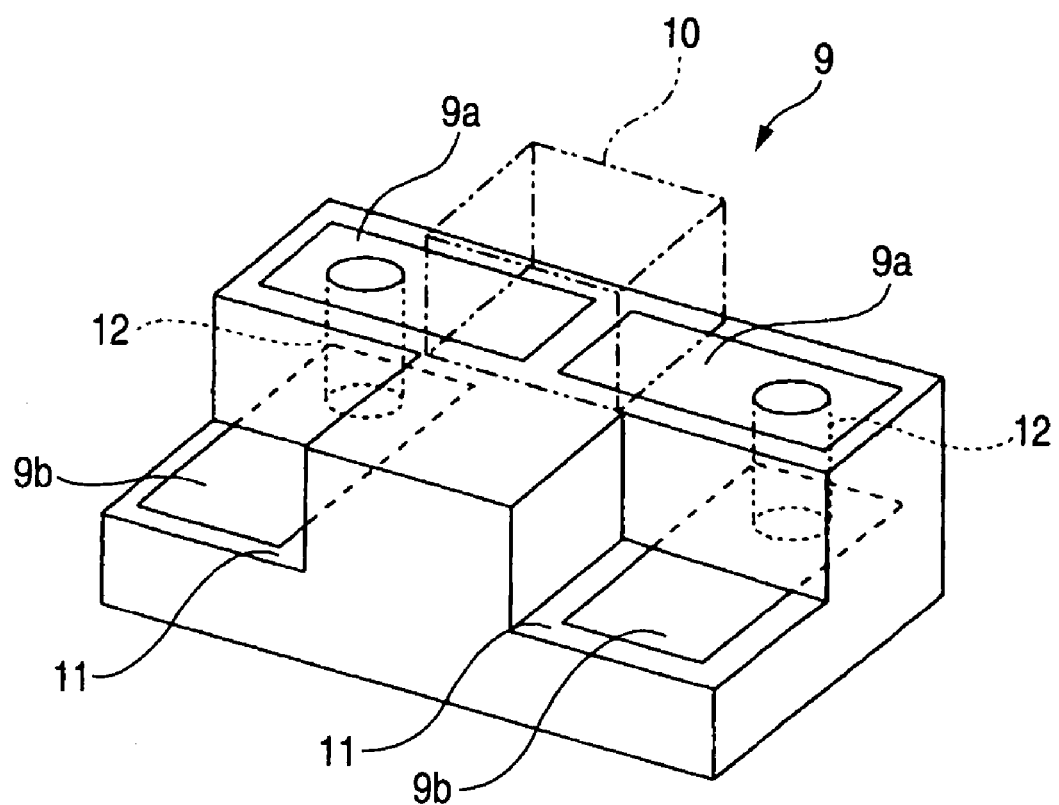
FIG. 3 is a schematic view illustrating an exemplary configuration of a sub-mount.

FIG. 2 illustrates the structure of the light-emitting device 7. FIG. 3 is a schematic view illustrating a sub-mount using a multilayer ceramic board.

As shown in FIG. 2, a sub-mount 9 is fixed on a circuit board 8 and an LED chip 10 (flip chip) is mounted on the surface layer thereof.

The sub-mount 9 uses a multilayer ceramic board. A conductor pattern is formed on each of the plurality of layers. Patterns formed on separate layers are connected with a via hole. This configuration allows wiring using a pattern in the surface layer as well as a pattern in an inner layer.

That is, to mount the LED chip 10, a pattern in the surface layer of the board may be used. For connection using a wire such as a gold wire, a pattern in another layer may be used.

In this example, as shown in FIG. 3, two corner parts of the sub-mount 9 are notched to form step parts 11, 11. From the step parts, patterns 9b, 9b (corresponding to the conductive patterns 3b) are exposed. In the surface layer of the sub-mount 9 are formed two patterns 9a, 9a (corresponding to the conductive patterns 3a) for mounting a flip-flop related to the LED chip 10. These patterns are respectively connected to the patterns 9a, 9b via internal conductors 12, 12 (see broken lines in FIG. 3).

In the case that the patterns 9b, 9b are placed in a lower position by one stage than the mounting surface of the LED chip 10 are connected to the conductive patterns 8a, 8a on the circuit board 8 assuming the circuit board 8 as a reference (see the large circle frame in FIG. 2) with wires 13, 13 such as gold wires, part of each wire are arranged so as not to protrude from the mounting surface of the LED chip 10 to avoid a shadow caused by the wires. This arrangement eliminates an adverse effect on light distribution.

In one or more embodiments, the length of the wire 13 may be reduced compared with the related art configuration, which improves reliability and reduces costs.

Figure 4:
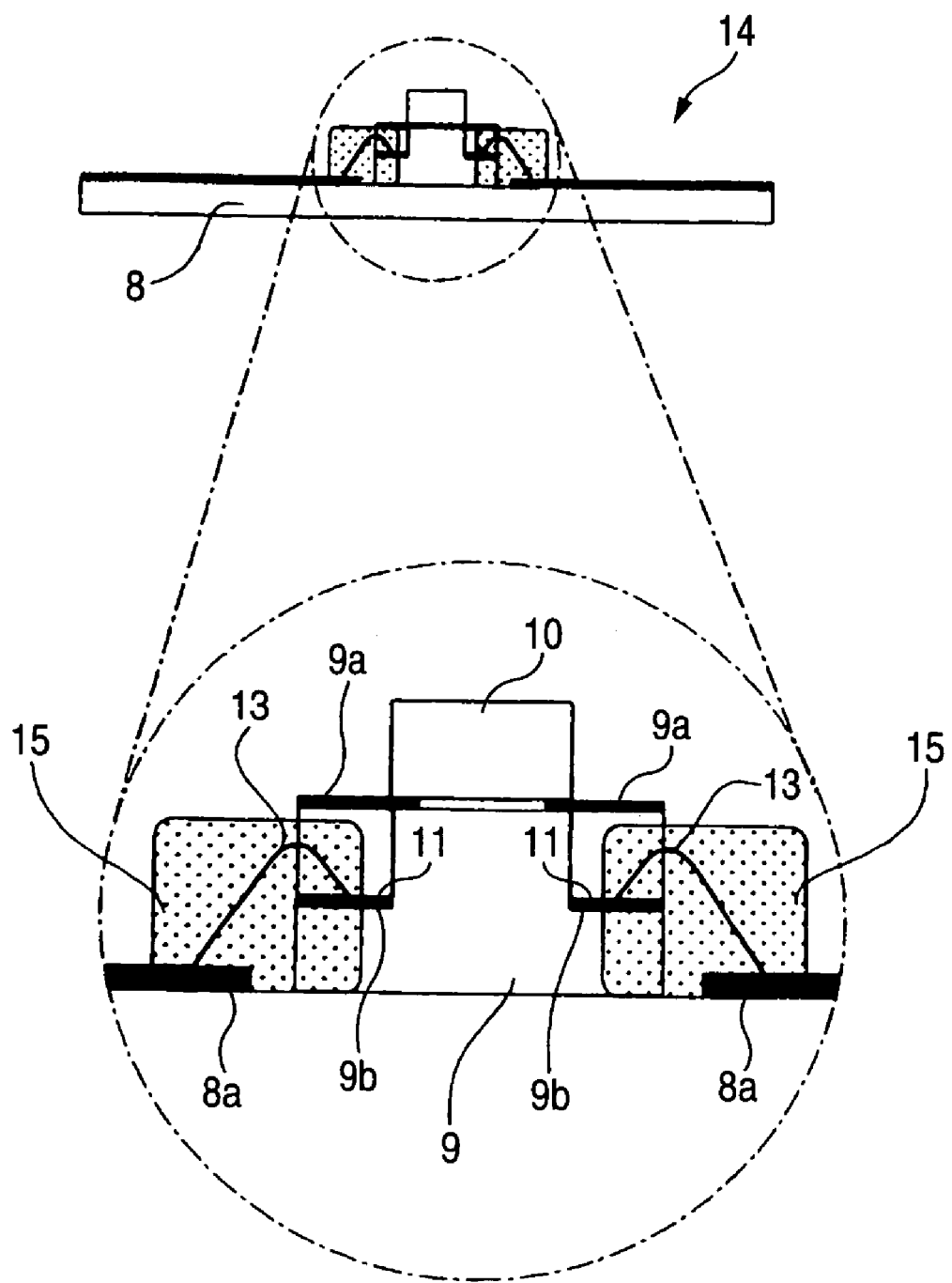
FIG. 4 shows another example of the light-emitting device according to an embodiment of the invention.

For embodiments where it is not necessary to use a hemispherical lens body formed by a transparent material to over the LED chip 10 and the sub-mount 9, like the light-emitting device 14 shown in FIG. 4 for example, a joint by the wire 13 may be hardened with a molding material such as a synthetic resin and glass, thereby providing a lens-less configuration.

That is, the part where the conductive pattern 8a of the circuit board 8 is connected to part of the pattern 9b of the sub-mount 9 using the wire 13 is covered by a covering material 15 (an electric insulating resin or glass material). This sufficiently protects a gold wire having a small diameter and low strength, with easier handling. A lens body can be omitted and the light quantity is not reduced.

In one or more embodiments, a material other than a gold wire, for example, a stiff member such as a large-diameter aluminum wire and a metallic ribbon may be used as a conductive wire for electric connection. This improves reliability without the need for the covering material as well as provides a lens-less configuration.

The above configuration where the mounting location of the LED chip 10 on the sub-mount 9 is not in the same plane as the bonding part (step part 11) of the wire 13 reduces the transmission amount of heat to the LED chip 10. This allows use of a bonding process having a great heating value such as welding, which is advantageous in terms of manufacture.

Figure 5:
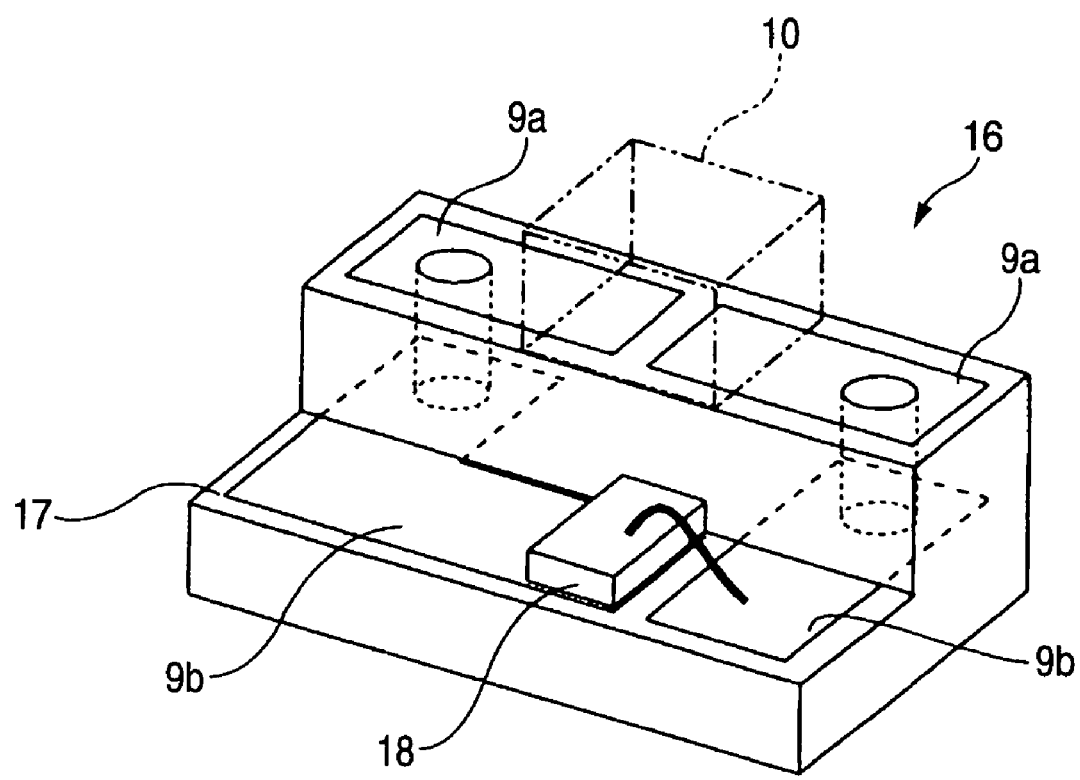
FIG. 5 is a perspective view showing an exemplary configuration where an electrostatic protection element is mounted on a sub-mount.

In one or more embodiments, by taking advantage of a multilayer board, as shown in FIG. 5 for example, it is possible to mount on a mount member an electrostatic protection element in electric connection with the semiconductor light-emitting element for protection of the semiconductor light-emitting element.

In the example shown in FIG. 5, a sub-mount 16 formed in a two-step staircase is used. On the higher step is mounted an LED chip 10 and on the lower step 17 is mounted a electrostatic protection element 18 such as a Zenor diode and a capacitor. This eliminates the need for mounting the electrostatic protection element 18 on the circuit board 8 thus allowing downsizing of a light-emitting device and simplified assembly. As a sub-mount, aluminum nitride may be used, which is advantageous over silicon (Si) in terms of heat dissipation of an element.

Next, configuration of light source apparatus using a light-emitting device according to one or more embodiments of the invention will be described.

Figure 6:
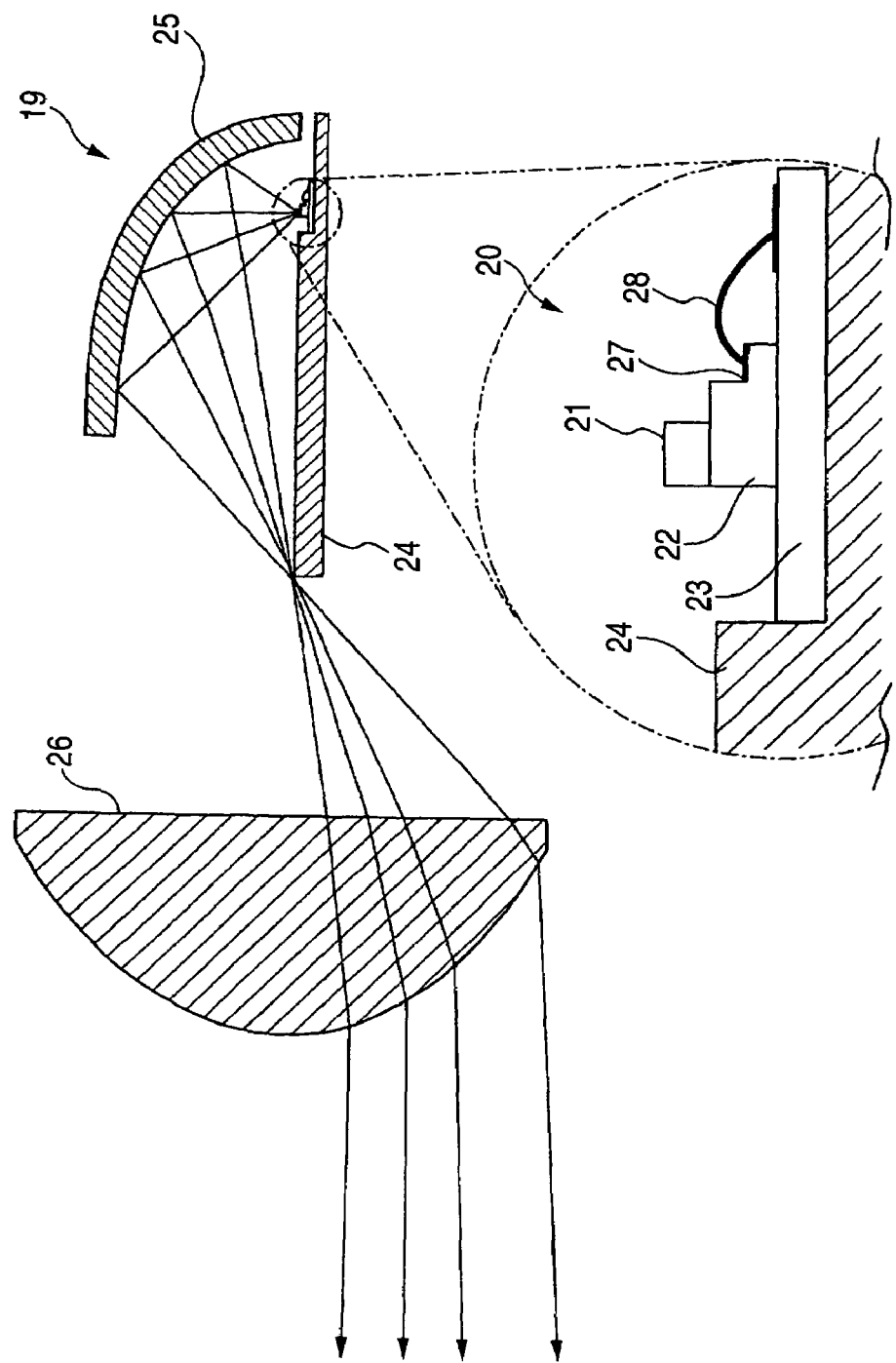
FIG. 6 is a schematic view showing an exemplary configuration of light source apparatus using the light-emitting device and the reflector according to an embodiment of the invention.
Figure 7:
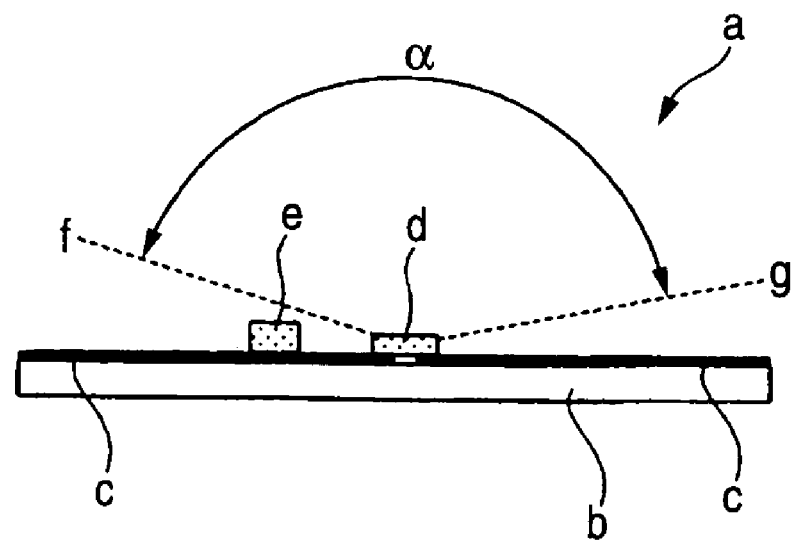
FIG. 7 is a schematic view showing an exemplary configuration according to the related art.

FIG. 6 is a schematic view of an exemplary configuration of light source apparatus using a light-emitting device and a projection optical system.

Light source apparatus 19 is used, for example, with an optical system arranged in a lamp body such as a vehicular lighting fixture and irradiating light in a predetermined direction.

The light-emitting deice 20 has a configuration where a mount member 22 mounting a semiconductor light-emitting element 21 such as an LED chip are mounted on a circuit board 23, as shown in an enlarged view in the alternate long and short dashed lines in FIG. 6.

The circuit board 23 is mounted on a support member 24 which has the function of a heat sink and the function of a shielding member (a so-called "shade"). This is effective for reducing the number of components.

As optical members constituting an optical system, a lens, a reflector, a shielding member and a filter are used. In this example, a reflector (ellipsoidal reflector) 25 and a projection lens (plane-convex lens) 26 are used. Light emitted from the light-emitting device 20 reaches the reflector 25 and is reflected on its inner surface and is incident on the projection lens 26 without being shielded at the tip of the support member 24, that is, an end positioned near the second focus of the reflector 25 on the side of the projection lens 26, and the light is irradiated forward from the emitting surface of the lens (leftward in the figure is the irradiation direction).

In the light-emitting device 20, part or the whole of the mount member 22 is composed of a multilayer board. In the surface layer of the multilayer board is formed a conductive pattern for mounting a semiconductor light-emitting element 21, same as the above example. The pattern and the semiconductor light-emitting element 21 are electrically connected.

On the multilayer board used for the mount member 22, a conductive pattern formed on a layer positioned on the side of the circuit board 23 is electrically connected to the conductor part of the circuit board 23.

In terms of the arrangement of the semiconductor light-emitting element 21 and the mount member 22, the semiconductor light-emitting element 21 facing in the direction of irradiation and the mount member 22 are positioned on the circuit board 23 with their side faces aligned. In other words, the two components are arranged with their side edges aligned along the direction orthogonal to the irradiation direction of the optical system.

On a section of the mount member 22 close to the other end of the mount member in opposite direction (rightward in the figure) to the irradiation direction is formed a step part 27 with part of a conductive pattern exposed. The conductive pattern exposed on the step part 27 and the conductor part of the circuit board 23 are electrically connected by conductive wires 28, 28 (only one of them is shown) provided so as not to shield light directed to the optical member 24 from the semiconductor light-emitting element 21.

When the irradiation direction is defined as "forward", the key points of this configuration are summarized below.

(1) The front end of the semiconductor light-emitting element 21 is aligned with the front end of the mount member 22.

(2) Light directed to the optical member (the reflector 25 in this example) from the semiconductor light-emitting element 21 is not shielded by the conductive wire 28.

(3) Light directed forward from the semiconductor light-emitting element 21 is not shielded by the conductive wire 28.

Items (1) through (3) above are preferable in one or more embodiments where an influence on the light application efficiency and light distribution is considered and have an important meaning for example in the formation of a cutoff line inherent to the low beam of a vehicular headlamp. That is, (1) is effective for formation of light distribution close to the upper end of a cutoff line that defines a contrast boundary in a light distribution pattern. (2) and (3) are effective for eliminating the influence of shielding of light by the conductive wire on the light distribution.

Formation of the step part 27 at the rear end of the mount member 22 to provide a staircase shape is effective in one or more embodiments for prevention of glare light. Without such a step part, a mount member is faced with occurrence of glare light or unwanted light caused by the influence of reflected light on the mounting surface of a semiconductor light-emitting element. Formation of the step part 27 in one or more embodiments matches the requirements of (2) and (3). In one or more embodiments where a conductive wire is arranged at the front of the mount member for electric continuity with the circuit board, the requirement of (2) is matched, but not the requirement of (3).

The configuration shown in FIG. 6 matches the requirements of (1) through (3). In a case where power is fed from the conductor part of the circuit board 23 to the semiconductor light-emitting element 21 via the conductive wire 28 and the conductive pattern of the mount member 22, it is possible to maximize the use of the light quantity of the semiconductor light-emitting element 21.

Various embodiments are possible such as mounting a plurality of semiconductor light-emitting elements on the sub-mount placed on the circuit board 23.

As described above, embodiments of the invention provide a configuration suitable for control of light distribution and high reliability in an application to a light-emitting device where a mount member mounting a semiconductor light-emitting element is mounted on a circuit board and light source apparatus using the light-emitting device, without a complicated configuration and a considerable increase in the costs.

What is claimed is:

1. A light-emitting device comprising:
   a mount member mounting
      a semiconductor light-emitting element, wherein the mount member is mounted on a circuit board,
   wherein at least part of the mount member comprises a multilayer board, and a first conductive pattern formed on a surface layer of the multilayer board and a semiconductor light-emitting element are electrically connected,
   wherein on the multilayer board, a second conductive pattern formed on a layer positioned closer to the circuit board than the first conductive pattern is electrically connected to a conductor part of the circuit board and power is fed from the conductor part to the semiconductor light-emitting element via the second conductive pattern and the first conductive pattern,
   wherein said mount member includes a step part exposing part of the second conductive pattern and
   wherein electric connection between the semiconductor light-emitting element and the first conductive pattern is made by face-down bonding, and wherein a conductive wire is used for electric connection between the second conductive pattern and the conductor part of the circuit board and the conductive wire does not protrude toward the element from a surface of the mount member mounting the semiconductor light-emitting element relative to the circuit board.

2. The light-emitting device according to claim 1, wherein a joint of the conductor part of the circuit board and part of the second conductive pattern by using a conductive wire is covered with an electric insulating resin or glass material.

3. The light-emitting device according to claim 1, wherein an electrostatic protection element electrically connected to the semiconductor light-emitting element is mounted on the step part.

4. A light source apparatus including a light-emitting device comprising:
   a mount member mounted on a circuit board;
   a semiconductor light-emitting element, mounted on the mount member at least a distance above the circuit board equal to a height of the mount member; and
   an optical system including an optical member,
   wherein at least part of the mount member comprises a multilayer board, and a first conductive pattern and a semiconductor light-emitting element formed on a surface layer of the multilayer board are electrically connected, wherein on the multilayer board, a second conductive pattern formed on a layer positioned closer to the circuit board than the first conductive pattern is electrically connected to a conductor part of the circuit board and power is fed from the conductor part to the semiconductor light-emitting element via the second conductive pattern and the first conductive pattern, and wherein an entirety of the electrical connection between the light-emitting element and the first conductive pattern and an entirety of the electrical connection between the second conductive pattern and the conductor part of the circuit board occur within the distance from the circuit board equal to the height of the mount member.

5. The light source apparatus according to claim 4, wherein a side face of the semiconductor light-emitting element oriented in a direction of irradiation of the optical system and a side face of the mount member oriented in the direction of irradiation are aligned with each other, and wherein a section close to another side face of the mount member in opposite direction to the direction of irradiation includes a step part exposing part of the second conductive pattern and the exposed part of the second conductive pattern and the conductor part of the circuit board are electrically connected by a conductive wire arranged so as not to shield light directed to the optical member from the semiconductor light-emitting element.

6. A light-emitting device comprising:
a multilayer board mounted on a circuit board;
a first conductive pattern formed on a surface layer of the multilayer board; and
a semiconductor light-emitting element mounted on the multilayer board at least a distance above the circuit board equal to a height of the multilayer board, wherein the first conductive pattern and the semiconductor light-emitting element are electrically connected, wherein on the multilayer board, a second conductive pattern formed on an intermediate layer positioned closer to the circuit board than the first conductive pattern is electrically connected to a conductor part of the circuit board with a conductive wire, and wherein power is fed from the conductor part to the semiconductor light-emitting element via the conductive wire and the conductive patterns; and wherein an entirety of the conductive wire is within the distance from the circuit board equal to the height of the multilayer board.

7. The light-emitting device of claim 6, wherein the conductive wire is a gold wire.

8. The light-emitting device according to claim 6, wherein the conductive wire is covered with an electric insulating resin or glass material.

* * * * *